United States Patent
Gao

(10) Patent No.: US 11,690,202 B2
(45) Date of Patent: Jun. 27, 2023

(54) HIGH AVAILABILITY HETEROGENEITY ELECTRONIC RACK SOLUTION

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 62 days.

(21) Appl. No.: 17/354,267

(22) Filed: Jun. 22, 2021

(65) Prior Publication Data
US 2022/0408611 A1 Dec. 22, 2022

(51) Int. Cl.
*H05K 7/20* (2006.01)
*H05K 7/14* (2006.01)

(52) U.S. Cl.
CPC ..... *H05K 7/20818* (2013.01); *H05K 7/20318* (2013.01); *H05K 7/20327* (2013.01); *H05K 7/1487* (2013.01); *H05K 7/203* (2013.01)

(58) Field of Classification Search
CPC ...... H05K 7/203–20327; H05K 7/208–20818; H05K 1/1487
See application file for complete search history.

(56) References Cited

U.S. PATENT DOCUMENTS

| | | | | |
|---|---|---|---|---|
| 3,586,101 A | * | 6/1971 | Chu | F25B 23/006 174/15.1 |
| 3,609,991 A | * | 10/1971 | Chu | H01L 23/427 174/15.1 |
| 8,184,436 B2 | * | 5/2012 | Campbell | H05K 7/203 361/701 |
| 9,921,622 B2 | * | 3/2018 | Shelnutt | H05K 7/20818 |
| 10,231,357 B2 | * | 3/2019 | Chainer | H05K 7/20354 |
| 10,448,543 B2 | * | 10/2019 | Farshchian | G06F 1/20 |
| 2016/0014933 A1 | * | 1/2016 | Matsunaga | B23P 19/00 361/679.53 |

* cited by examiner

*Primary Examiner* — Zachary Pape
(74) *Attorney, Agent, or Firm* — Womble Bond Dickinson (US) LLP

(57) ABSTRACT

An electronic rack includes one or more servers, where each server is contained within a respective server container, and each server is at least partially submerged in two-phase liquid coolant, where, while the server generates heat that is transferred to the two phase liquid coolant thereby causing some of the two phase liquid coolant to turn into a vapor. The electronic rack includes a condenser container and condensing coils mounted at a top portion of the electronic rack to condense the vapor into the two-phase liquid coolant. The electronic rack includes a vapor manifold along a length of the electronic rack, the vapor manifold coupling the condenser container to a respective server, where the vapor manifold carries the vapor from the servers to the condensing coils. The electronic rack includes a first return line coupled to the condenser container, to return the two-phase liquid coolant to a coolant unit.

20 Claims, 8 Drawing Sheets

HIGH AVAILABILITY HETEROGENEITY ELECTRONIC RACK SOLUTION

FIELD OF THE INVENTION

Embodiments of the present invention relate generally to server and data center cooling. More particularly, embodiments of the invention relate to a high availability heterogeneity electronic rack solution.

BACKGROUND

Thermal management for a data center that includes several active electronic racks is critical to ensure proper performance of servers and other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit. One common cooling unit is a computer room air conditioning (CRAC) unit that is a device that intakes hot exhaust return air and supplies cooling air to maintain a data center's thermal environment.

Recently, data centers have been deploying more high-power density electronic racks, where more high-density chips are packaged closer together to provide more computing power. Cooling these high-density racks by maintaining a proper thermal environment may be an issue with existing cooling systems, such as a CRAC unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks.

Immersion cooling, on the other hand, which involves at least partially submerging electronics in a dielectric solution is a feasible solution for high-density electronics. Implementing immersion cooling in existing data centers, however, has challenges. For example, a data center's cooling infrastructure may need to be modified to be able to support operating an immersion cooling system, since existing data centers are designed for either air cooling or other types of liquid cooling. Also, immersion cooling is a more complex cooling solution than existing air/liquid solutions. For instance, single-phase immersion cooling requires complex hardware design for electronic components, mechanical pumps that may fail/leak, and significant room modification for deployment in a data center. As another example, conventional two-phase immersion cooling systems include a condenser that is packaged within an immersion tank along with the submerged electronics (e.g., positioned above the electronics). When maintenance is performed (e.g., when a server needs to be replaced), a data center onsite operator must remove the condenser from the tank, thereby breaking the existing cooling loop which may lead to a loss of dielectric solution. In addition, in order to prevent overheating while performing maintenance, the electronics within the tank may be shut down, which results in service interruption.

Existing solutions for immersion system do not efficient solve the challenges of populated electronic racks that are highly heterogeneous, where the design and operation of each individual server populated on the electronic racks can vary server to server.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
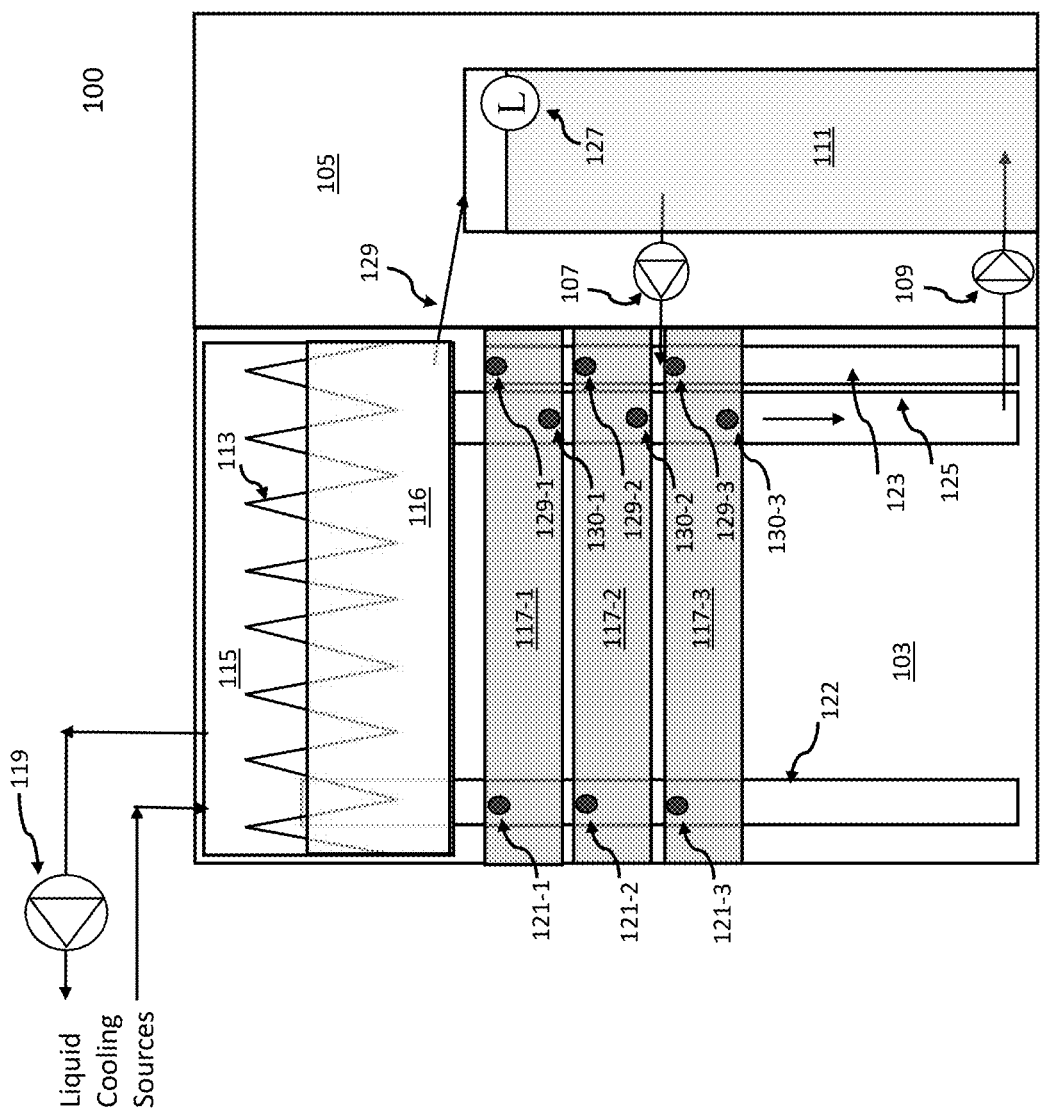
FIG. 1 is a block diagram illustrating an example of a cooling system architecture according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Aspect of the present disclosure are directed to an electronic rack design that implements two phase cooling for servers. The servers are designed to be at least partially submerged in two phase coolant for cooling. The electronic rack includes a vapor manifold that carries vapor from the individual servers to a rack-mounted condenser near a top portion of the electronic rack. The condenser includes a liquid container and the liquid contained in the container can be delivered to the servers. A standalone coolant unit (or coolant unit) can manage the two-phase coolant that is filled to the servers at the electronic rack. The overall design allows multiple paths for two-phase coolant to be sourced to the servers to accommodate different server power conditions as well as different types of servers, in a highly heterogeneity populated electronic rack.

According to one aspect, an electronic rack includes one or more servers, where each of the one or more servers is contained within a respective server container, and each of the one or more servers is at least partially submerged within two-phase liquid coolant, where, while the one or more servers provides IT services, the one or more servers generate heat that is transferred to the two phase liquid coolant thereby causing at least some of the two phase liquid coolant to turn into a vapor. The electronic rack includes a condenser container mounted at a top portion of the electronic rack and a cooling condenser (or condensing coils) above the condenser container to condense the vapor into the two-phase liquid coolant. The electronic rack includes a vapor manifold situated along a length of the electronic rack, the vapor manifold coupling the condenser container to a respective server container of the one or more servers, where the vapor manifold channels the vapor from the one or more servers to the cooling condenser. The electronic rack includes a first return line coupled to the condenser container, where the first return line returns the two-phase liquid coolant contained in the condenser container to a coolant unit.

In one embodiment, the electronic rack further includes a pump along a length of the first return line to actively return the two-phase liquid coolant from the condenser container to the coolant unit. In one embodiment, the electronic rack further includes a liquid manifold situated along a length of the electronic rack, the liquid manifold coupled to the condenser container. The electronic rack includes a second return line coupled between the liquid manifold and the coolant unit, where the first return line and/or the second return line returns two-phase liquid coolant from the condenser container to the coolant unit.

In one embodiment, the electronic rack includes a third return line coupled between the first and the second return line, and a valve along a length of the third return line to switch on/off a connection path for two-phase liquid coolant to flow from the first return line to the second return line. In one embodiment, the liquid manifold is coupled in between the first return line and the condenser container.

In one embodiment, the condenser container mounted at the top portion of the electronic rack comprises an inlet port and an outlet port, wherein a pump circulates a cooling liquid through coils of the cooling condenser. In one embodiment, the cooling liquid is a different cooling medium than the two-phase liquid coolant. In one embodiment, the inlet port and outlet ports are situated at a side of the condenser container and the inlet port and outlet port enable the pump to circulate the cooling liquid through an interior of the coolant unit.

In one embodiment, the electronic rack further includes a supply line between the coolant unit and the one or more servers to supply two-phase liquid coolant from the coolant unit to the one or more servers. In one embodiment, the coolant unit is situated adjacent to the electronic rack.

According to a second aspect, an information technology (IT) equipment cooling system includes a coolant unit to supply two-phase liquid coolant and an electronic rack coupled to the coolant unit. The electronic rack includes one or more servers, where each of the one or more servers is contained within a respective server container, and each of the one or more servers is at least partially submerged within two-phase liquid coolant, where, while the one or more servers provides IT services, the one or more servers generate heat that is transferred to the two phase liquid coolant thereby causing at least some of the two phase liquid coolant to turn into a vapor. The electronic rack includes a condenser container mounted at a top portion of the electronic rack and a cooling condenser housed in the condenser container to condense the vapor into the two-phase liquid coolant. The electronic rack includes a vapor manifold situated along a length of the electronic rack, the vapor manifold coupling the condenser container to a respective server container of the one or more servers, where the vapor manifold channels the vapor from the one or more servers to the cooling condenser. The electronic rack includes a first return line coupled to the condenser container, wherein the first return line returns the two-phase liquid coolant contained in the condenser container to the coolant unit.

FIG. 1 is a block diagram illustrating an example of a cooling system architecture 100 according to one embodiment. Cooling system architecture 100 can include an electronic rack 103 and a coolant unit 105. A condensing unit 115 can be mounted on top of electronic rack 103 and condensing unit 115 can be packaged with a container 116. Electronic rack 103 can include one or more servers 117-1, 117-2, 117-3 populated on electronic rack 103, where servers 117-1, 117-2, 117-3 are housed in respective server containers or immersion tanks and the server containers are connected to a vapor manifold 122. Vapor generated within servers 117-1, 117-2, 117-3 can travel to condensing unit 115 via vapor manifold 122 through ports 121-1, 121-2, 121-3. Each of servers 117 may include one or more electronic devices such as a processor, memory, a storage device, etc. that when operate, generate heat.

Electronic rack 103 can include a set of liquid distribution manifolds, where the set of liquid distribution manifolds includes a server fluid supply manifold 123 and server fluid release manifold 125. Server fluid supply manifold 123 and server fluid release manifold 125 can supply/release a two-phase liquid coolant to/from servers 117-1, 117-2, 117-3, respectively. Although only three servers are shown, cooling system architecture 100 can include any number of servers.

Coolant unit 105 can include container 111 to store two-phase liquid coolant. In one embodiment, container 111 is connected to container 116 of condensing unit 115. In one embodiment, container 111 is connected to fluid supply manifold 123 and fluid release manifold 125. In one embodiment, charging pump 107 is coupled in between the fluid supply manifold 123 and container 111, and charging pump 107 can charge fluid supply manifold 123 with coolant from container 111. Draining pump 109 can be coupled in between the fluid release manifold 125 and container 111, draining pump 109 can release coolant from fluid release manifold 125 to container 111. In one embodiment, coolant unit 105 includes a fluid level sensor 127, where a signal of fluid level sensor 127 is used to regulate a fluid level at coolant unit 105. For example, the signal can be used by a facility level coolant supply and return that is connected to coolant unit 105, where the two phase liquid coolant level in container 111 is regulated by the facility level coolant supply and return.

In one embodiment, servers 117-1, 117-2, 117-3 are designed with immersion cooling, where individual servers 117-1, 117-2, 117-3 are contained within a respective server container. Each of the one or more servers 117-1, 117-2, 117-3 is at least partially submerged within two-phase liquid coolant within respective containers, where, while the one or more servers 117-1, 117-2, 117-3 provides IT services, the one or more servers 117-1, 117-2, 117-3 generate heat that is transferred to the two-phase liquid coolant thereby causing at least some of the two phase liquid coolant to turn into vapor state.

Vapor within respective containers of servers 117-1, 117-2, 117-3 can travel to condensing unit 115, and condensing coils 113 of condensing unit 115 condenses the vapor back to liquid phase coolant, where the liquid phase coolant can be collected in container 116. Here, cooling liquid can be supplied from a cooling liquid source to condensing coils 113, via recirculation pump 119, where cooling liquid is to be circulated through condensing coils 113. Cooling liquid then carries heat extracted from the vapor through the condensing coils 113 and exits condensing unit 115. In one embodiment, two phase liquid coolant is channeled from condensing container 116 to container 111 coolant unit 105 via line 129 by gravity.

In one embodiment, cooling liquid circulating from liquid cooling source is different from two phase liquid coolant. In one embodiment, cooling liquid is a single phase cooling fluid such as cooling water, and two phase liquid coolant is a dielectric solution.

Servers 117-1, 117-2, 117-3 can be pumped with two-phase liquid coolant. In one embodiment, servers 117-1, 117-2, 117-3 are pumped continuously, or at a predetermined time interval, with two-phase liquid coolant from container 111, thereby allowing two-phase liquid coolant to continuously extract heat that is generated by IT electronics housing in servers 117-1, 117-2, 117-3. Two-phase liquid coolant is to undergo a state change from liquid state to vapor state, where vapor exits servers 117-1, 117-2, 117-3 via vapor manifold 122. Here, charging pump 107 may periodically pump two-phase liquid coolant in liquid phase to servers 117-1, 117-2, 117-3, at a timed interval or based on a sensed temperature of the servers. In one embodiment, draining pump 109 operates when individual servers 117-1, 117-2, 117-3 need to release two-phase liquid coolant, such as for services and maintenance. It needs to be mentioned that servers 117-1, 117-2, 117-3 can include control valves (not shown) at respective ports 129-1, 129-2, 129-3, 130-1, 130-2, 130-3 which are coupled to fluid supply manifold 123 and/or fluid release manifold 125, respectively, to control when fluid is to enter/exit respective servers 117-1, 117-2, 117-3. In summary, FIG. 1 shows that liquid coolant can flow between containers 116 and 111 through either line 129 or fluid releasing manifold 125.

Figure 2:
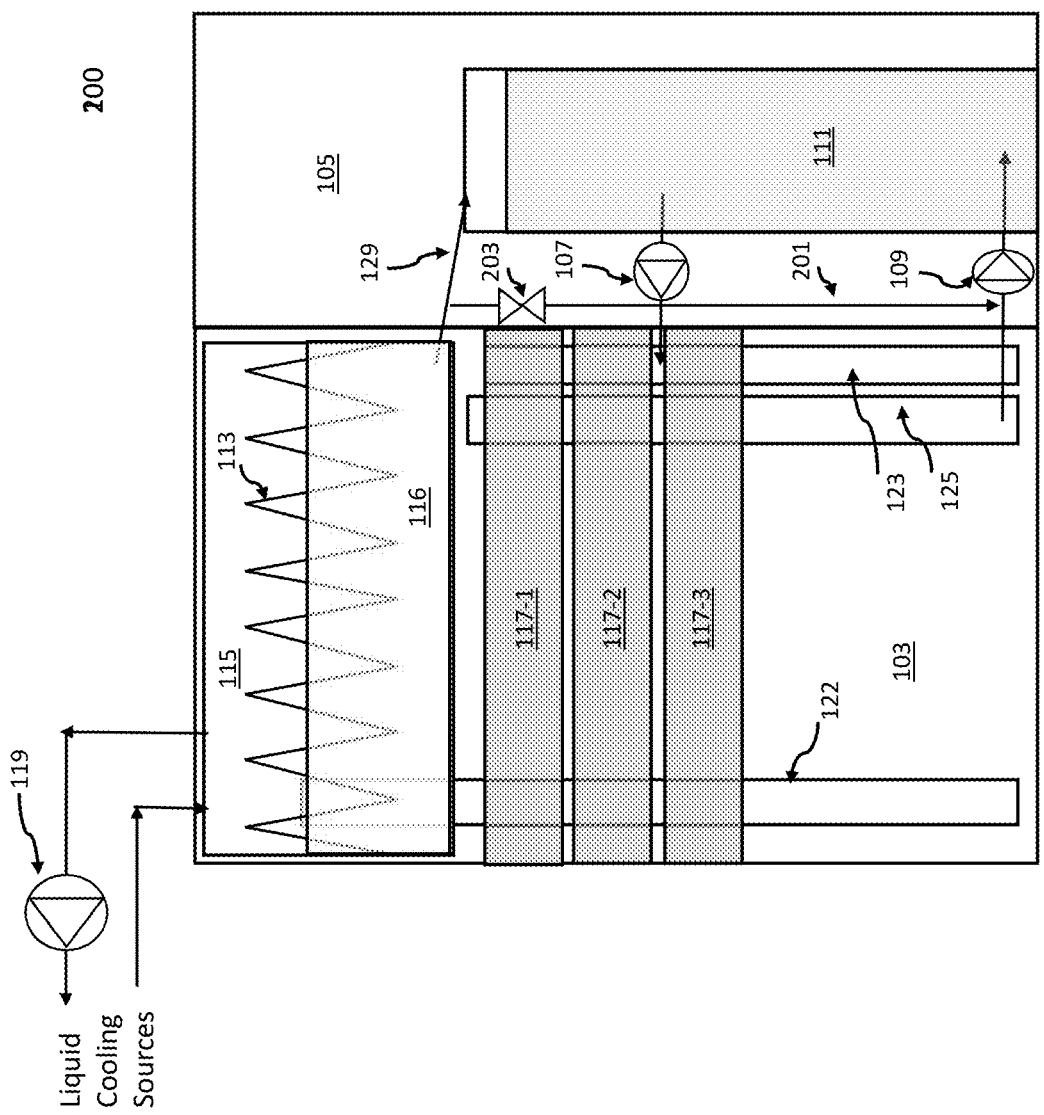
FIG. 2 is a block diagram illustrating a cooling system with additional fluid path from a condenser container to a coolant container according to one embodiment.

FIG. 2 is a block diagram illustrating a cooling system 200 with additional fluid path 201 from condenser container 116 to coolant container 111 according to one embodiment. Cooling system 200 can represent cooling system 100 of FIG. 1. In one embodiment, cooling system 200 can include a direct connection line 129, and secondary connection line 201 to release liquid from condenser container 116 to coolant container 111, where secondary connection line 201 extends from direct connection line 129 to draining pump 109. This embodiment allows draining pump 109 to assist a flow of the two-phase fluid from condenser container 116 to coolant container 111. In one embodiment, connection line 201 includes a valve 203 controllable to open or close connection line 201. In one embodiment, fluid releasing manifold 125 may or may not be connected to condensing unit 115. It can be seen in FIG. 2 that condensing unit 115 is not connected to fluid releasing manifold 125 in this design variation.

Figure 3:
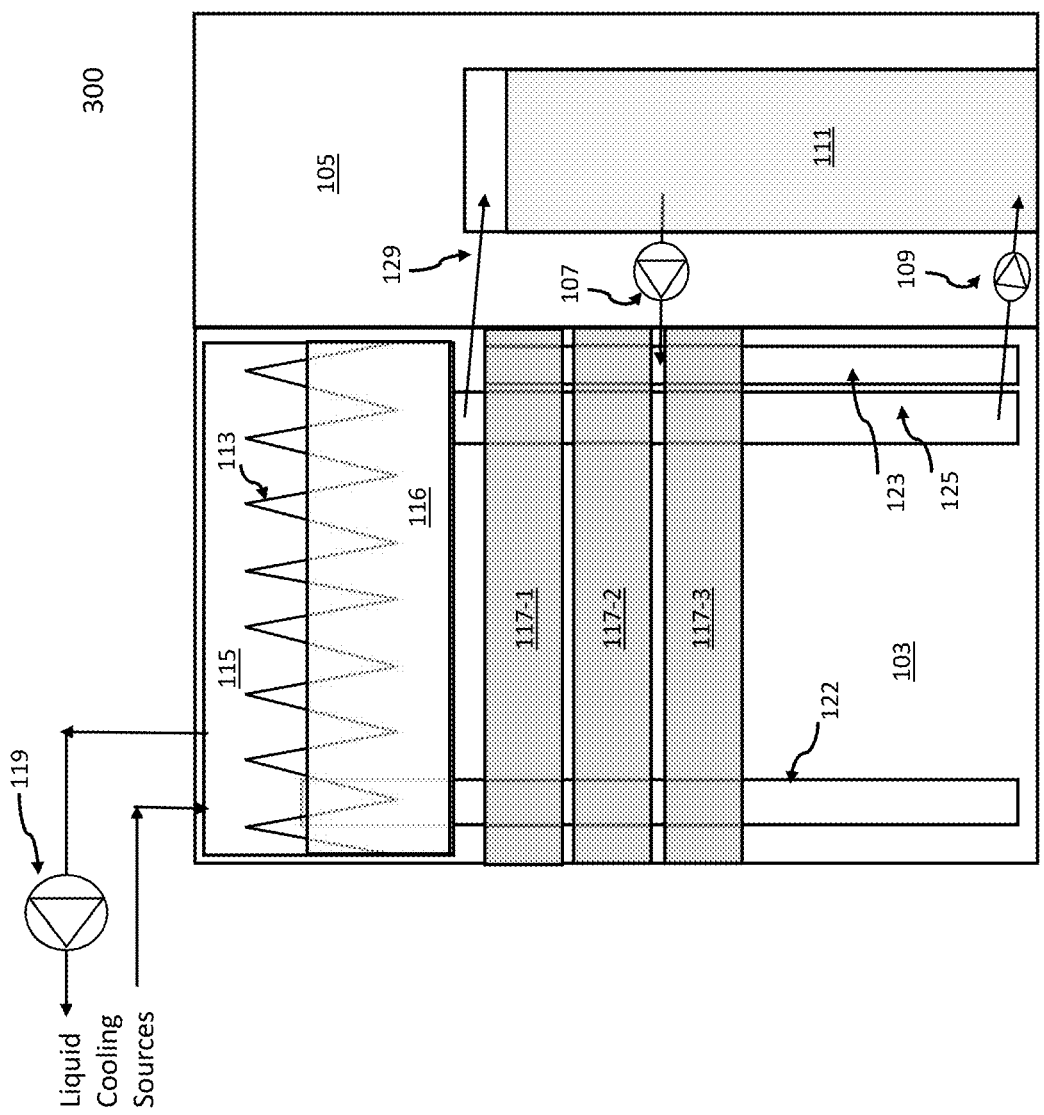
FIG. 3 is a block diagram illustrating a cooling system with a fluid connection at a fluid release manifold according to one embodiment.

FIG. 3 is a block diagram illustrating a cooling system 300 with a fluid connection at a fluid release manifold according to one embodiment. Cooling system 300 can represent cooling system 100 of FIG. 1. In one embodiment, cooling system 300 can include connection line 129, where connection line 129 is coupled between fluid releasing manifold 125 and coolant unit container 111. The condensing unit 115 is connected to the return manifold 125. This variation in design can eliminate an outlet port at condenser container 116, that would otherwise be required if connection line 129 is to be coupled to condenser container 116.

Figure 4:
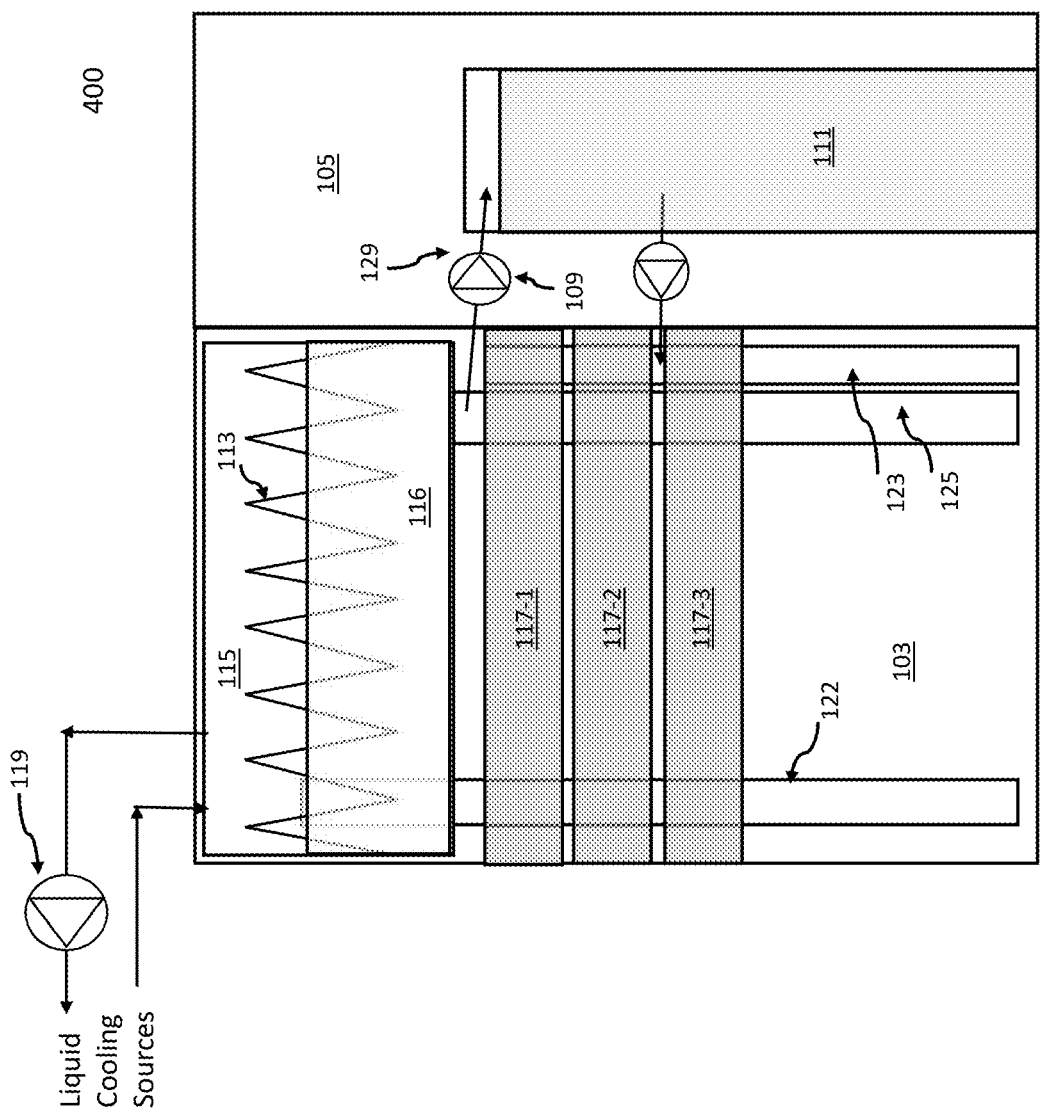
FIG. 4 is a block diagram illustrating a cooling system with a fluid connection according to one embodiment.

FIG. 4 is a block diagram illustrating a cooling system 400 with a fluid connection according to one embodiment. Cooling system 400 can represent cooling system 100 of FIG. 1. In one embodiment, cooling system 400 includes only one connection line 129 between fluid release manifold 125 and the coolant unit container 111. Connection line 129 can include a discharge pump 109, where connection line 129 serves as a fluid release for servers 117-1, 117-2, 117-3 as well as condensing unit 115.

Figure 5:
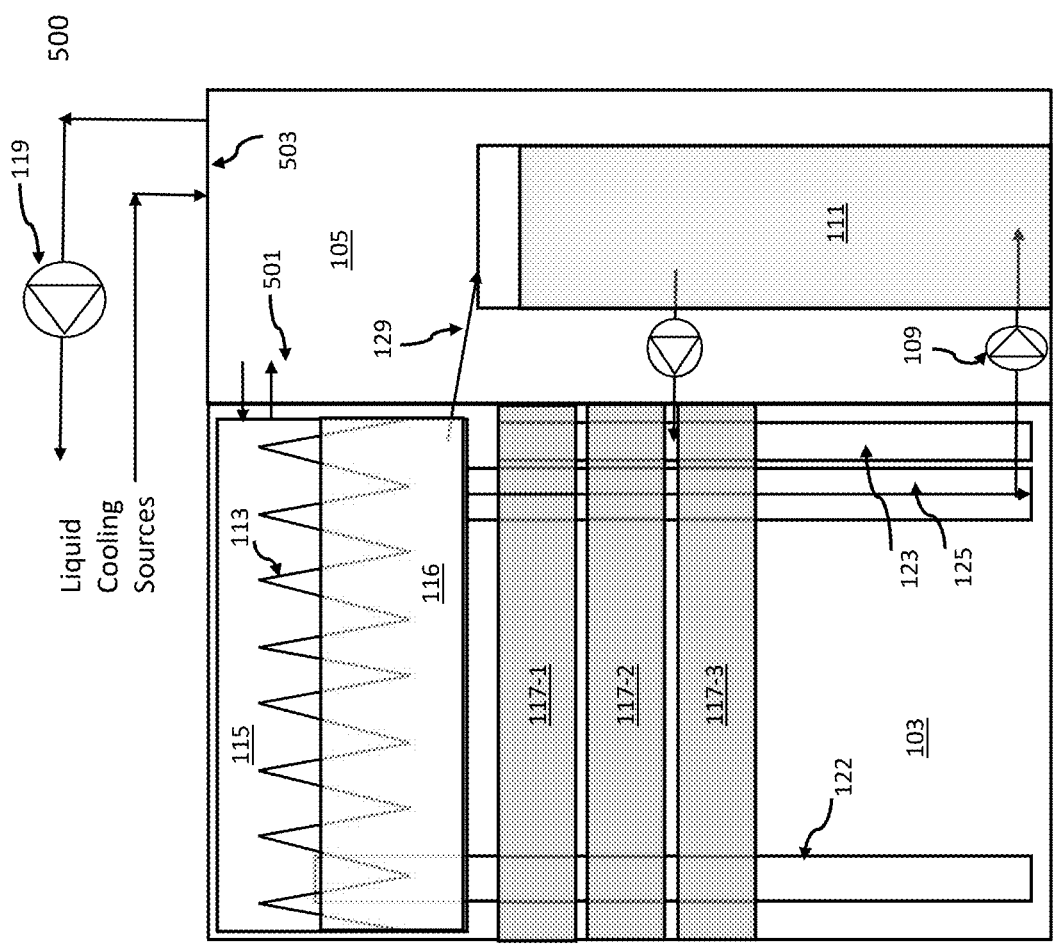
FIG. 5 is a block diagram illustrating a cooling system with fluid ports at the adjacent coolant unit according to one embodiment.

FIG. 5 is a block diagram illustrating a cooling system 500 with cooling liquid ports at coolant unit 105 according to one embodiment. Cooling system 500 can represent cooling system 100 of FIG. 1. Cooling system 500 illustrates a variation in design where condenser unit 115 receives cooling liquid through coolant unit 105, and coolant unit 105 includes ports 501, 503 to route a coolant liquid loop through coolant unit 105. Here, condenser unit 115 receives a cooling liquid from cooling liquid source through coolant unit 105. In one embodiment, condenser unit 115 is an air cooled condenser unit and includes an air cooled condenser. Thus, this variation in design allows coolant unit 105 to house all fluid ports (two-phase liquid coolant and cooling liquid) that are charged/drained from electronic rack 103.

Figure 6:
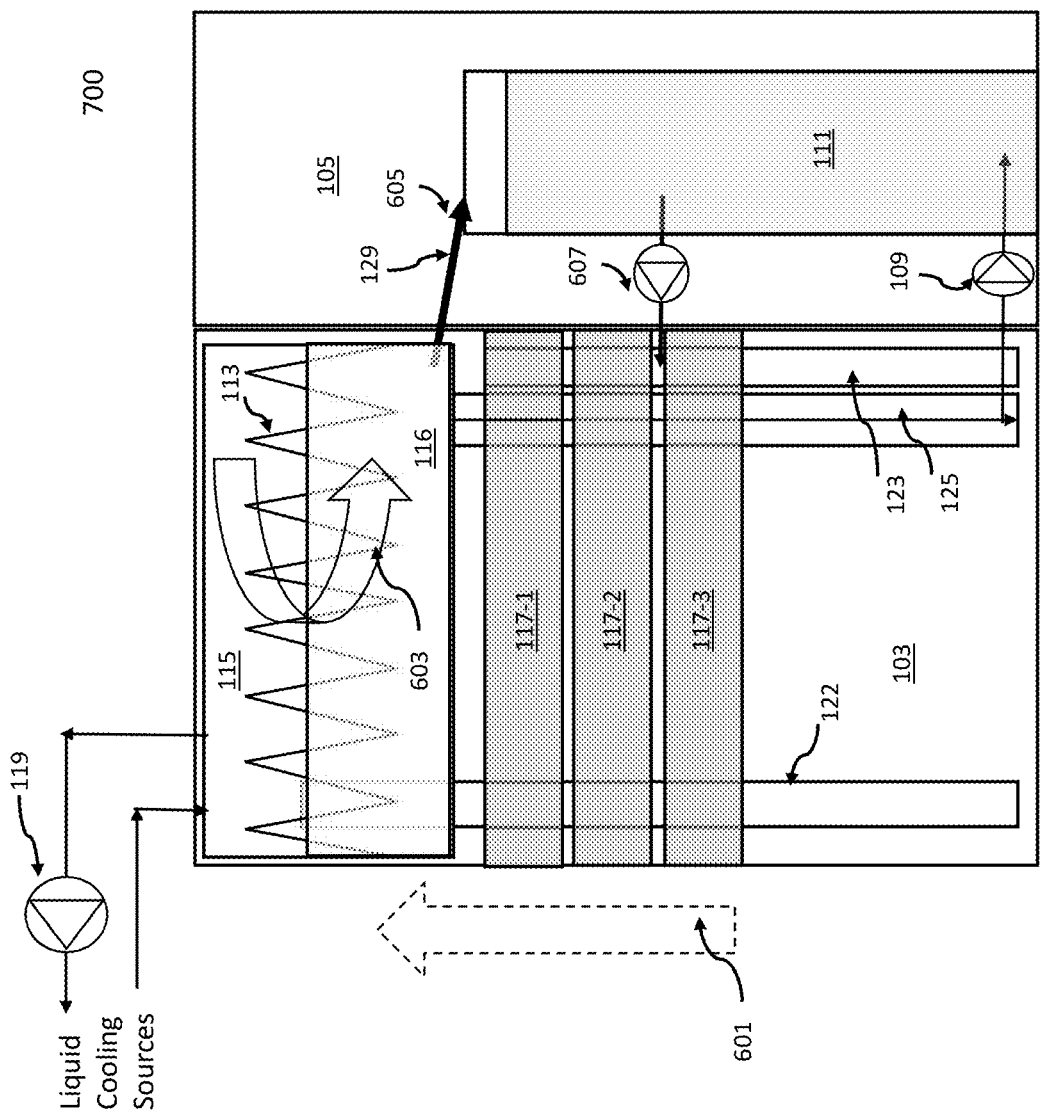
FIG. 6 is a block diagram of a cooling system illustrating a coolant path according to one embodiment.

FIG. 6 is a block diagram of a cooling system illustrating a coolant path according to one embodiment. FIG. 6 illustrates two-phase coolant paths for cooling system 600. Cooling system 600 can represent cooling system 100 of FIG. 1. Referring to FIG. 6, dash path 601 shows a vapor path rising to condensing unit 115. Path 603 shows that circulation pump 119 is supplying cooling liquid to condensing coils 113 of condensing unit 115 for condensing coils 113 to condense vapor into liquid phase. Path 605 illustrates that a directional fluid flow from container 116 to container 111, via line 129 can be driven by gravity or a pump. Path 607 illustrates that charging pump 107 can pump two-phase liquid coolant from container 111 to servers 117-1, 117-2, and 117-3.

Figure 7:
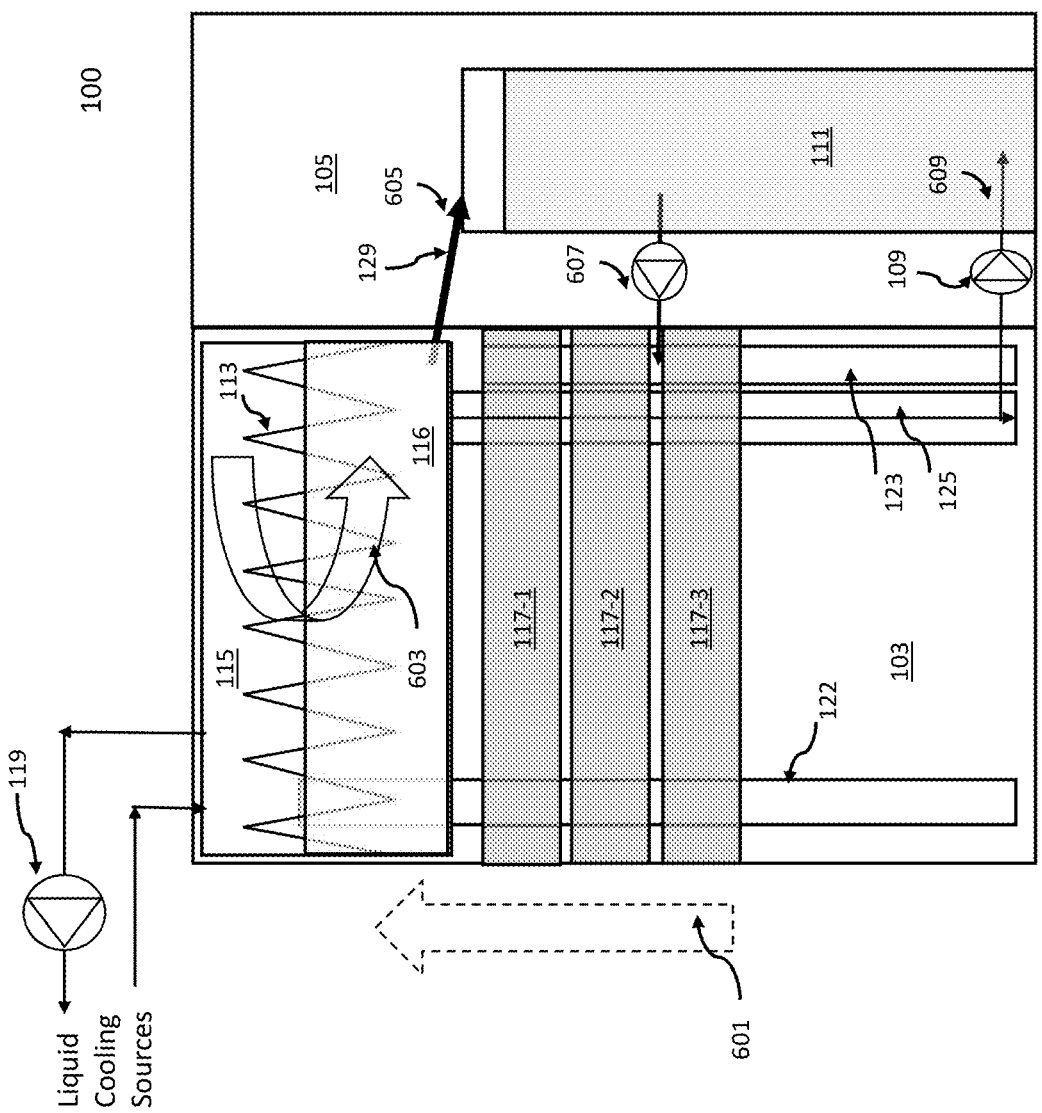
FIG. 7 is a block diagram of a cooling system illustrating additional coolant paths according to one embodiment.

FIG. 7 is a block diagram of a cooling system illustrating additional coolant paths according to one embodiment. Cooling system 700 can represent cooling system 600 of FIG. 6. In addition to the paths shown in FIG. 6, FIG. 7 illustrates additional two-phase coolant path 609 from container 116 to container 111. Path 609 allows cooling system 700 to quickly drain two-phase liquid coolant from container 116 to container 111. These variations in designs for the additional path 609 can remove heat loads from servers 117-1, 117-2, and 117-3 at different rates. E.g., cooling system with servers of a high heat capacity can adapt cooling system 700 with the additional release path 609. In one embodiment, paths 605, 607, and 609 can be controlled independently.

Figure 8:
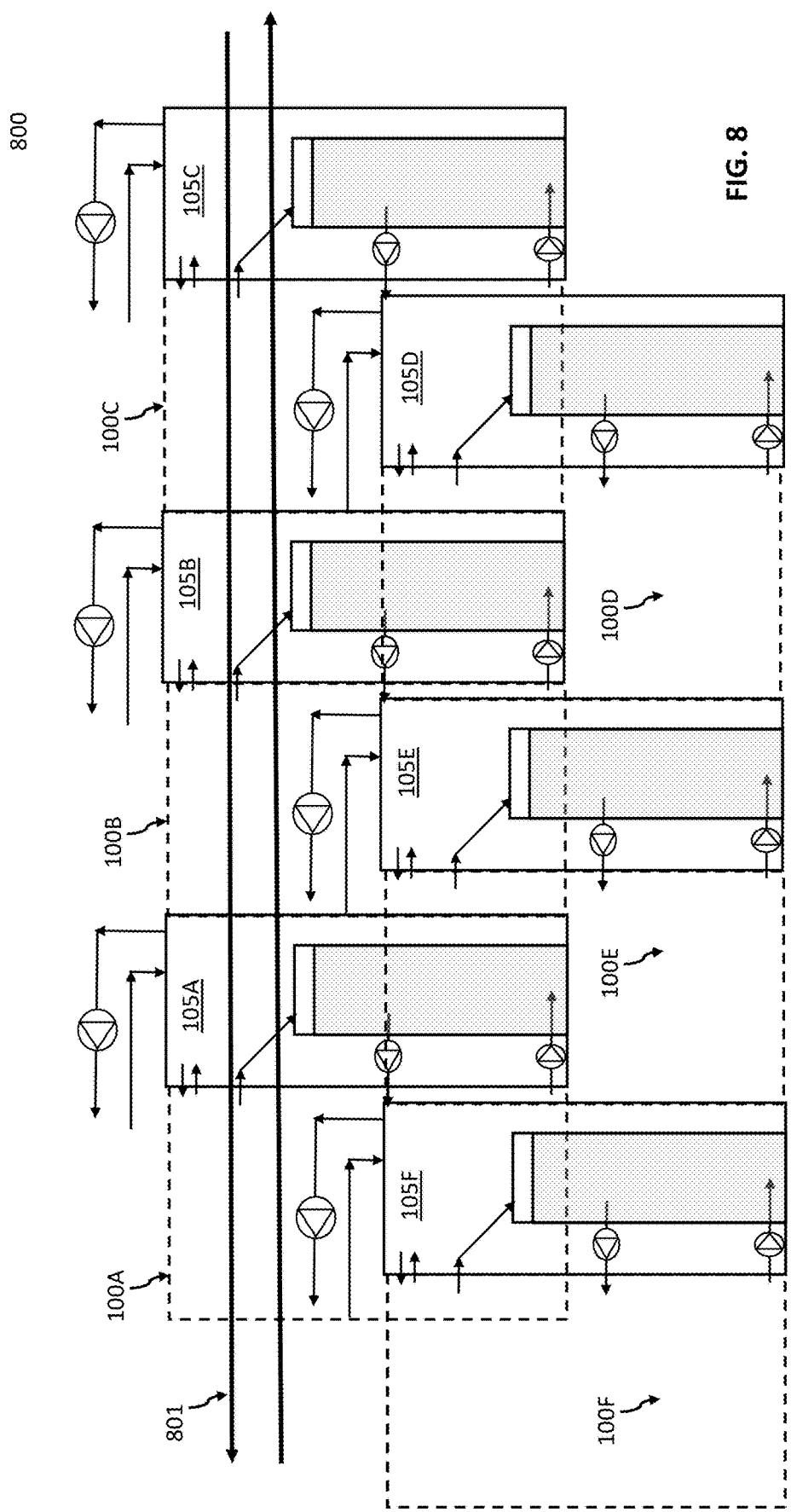
FIG. 8 is a block diagram illustrating a facility loop connecting one or more cooling systems according to one embodiment.

FIG. 8 is a plan view of a block diagram illustrating a facility loop 801 connecting one or more cooling systems 100A-100F according to one embodiment. Facility system 800 includes facility loop 801 that is connected to individual coolant units 105A-105F of cooling systems 100A-100F. In one embodiment, coolant units 105A-105F are populated and commissioned before corresponding electronic racks are deployment. It can be seen that such a facility system 800 allows a fast and efficient solution for electronic racks and servers to be deployed, since coolant units 105A-105F can manage to have both cooling fluid and two-phase cooling coolants to pass through coolant units 105A-105F.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
   one or more servers, wherein each of the one or more servers is contained within a respective server container, and each of the one or more servers is at least partially submerged within two-phase liquid coolant, wherein, while the one or more servers provides IT services, the one or more servers generate heat that is transferred to the two phase liquid coolant thereby causing at least some of the two phase liquid coolant to turn into a vapor;
   a condenser container mounted at a top portion of the electronic rack;
   a cooling condenser housed in the condenser container to condense the vapor into the two-phase liquid coolant;
   a vapor manifold situated along a length of the electronic rack, the vapor manifold coupling the condenser container to a respective server container of the one or more servers, wherein the vapor manifold channels the vapor from the one or more servers to the cooling condenser;
   a liquid supply manifold situated along a length of the electronic rack, wherein the liquid release manifold is configured to channel two-phase liquid coolant to each of the respective server containers;
   a liquid release manifold situated along a length of the electronic rack, wherein the liquid supply manifold is configured to channel two-phase liquid coolant from each of the respective server containers; and
   a first return line coupled to the condenser container, wherein the first return line returns the two-phase liquid coolant contained in the condenser container to a coolant unit.

2. The electronic rack of claim 1, further comprising: a pump along a length of the first return line to actively return the two-phase liquid coolant from the condenser container to the coolant unit.

3. The electronic rack of claim 1,
   wherein the liquid release manifold is coupled to the condenser container,
   and the electronic rack further comprising a second return line coupled between the liquid release manifold and the coolant unit, wherein the first return line and/or the second return line returns two-phase liquid coolant from the condenser container to the coolant unit.

4. The electronic rack of claim 3, further comprising:
   a third return line coupled between the first and the second return line; and
   a valve along a length of the third return line to switch on/off a connection path for two-phase liquid coolant to flow from the first return line to the second return line.

5. The electronic rack of claim 3, wherein the liquid release manifold is coupled in between the second return line and the condenser container.

6. The electronic rack of claim 1, wherein the condenser container mounted at the top portion of the electronic rack comprises an inlet port and an outlet port, wherein a pump circulates a cooling liquid through coils of the cooling condenser via the inlet and outlet ports.

7. The electronic rack of claim 6, wherein the condenser container is coupled to a container in the coolant unit via the first return line and at least a portion of the container in the coolant unit is located below the condenser container.

8. The electronic rack of claim 6, wherein the inlet port and outlet port are situated at a side of the condenser container.

9. The electronic rack of claim 1, further comprising a supply line between the coolant unit and the one or more servers to supply two-phase liquid coolant from the coolant unit to the one or more servers.

10. The electronic rack of claim 1, wherein the coolant unit is situated adjacent to the electronic rack.

11. An information technology (IT) equipment cooling system, comprising:
    a coolant unit to supply two-phase liquid coolant; and
    an electronic rack coupled to the coolant unit, the electronic rack comprising:
      one or more servers, wherein each of the one or more servers is contained within a respective server container, and the server is at least partially submerged within two-phase liquid coolant, wherein, while the one or more servers provides IT services, the one or more servers generate heat that is transferred to the two phase liquid coolant thereby causing at least some of the two phase liquid coolant to turn into a vapor;
      a condenser container mounted at a top portion of the electronic rack;
      a cooling condenser housed in the condenser container to condense the vapor into the two-phase liquid coolant;
      a vapor manifold situated along a length of the electronic rack, the vapor manifold coupling the cooling condenser to a respective server container of the one or more servers, wherein the vapor manifold channels the vapor from the one or more servers to the cooling condenser;
      a liquid supply manifold situated along a length of the electronic rack, wherein the liquid supply manifold is configured to channel two-phase liquid coolant to each of the respective server containers;
      a liquid release manifold situated along a length of the electronic rack, wherein the liquid release manifold is configured to channel two-phase liquid coolant from each of the respective server containers; and
      a first return line coupled to the condenser container, wherein the first return line returns the two-phase liquid coolant contained in the condenser container to the coolant unit.

12. The IT equipment cooling system of claim 11, further comprising: a pump along a length of the first return line to actively return the two-phase liquid coolant from the condenser container to the coolant unit.

13. The IT equipment cooling system of claim 11,
    wherein the liquid release manifold is coupled to the condenser container,
    and the IT equipment cooling system further comprising a second return line coupled between the liquid release manifold and the coolant unit, wherein the first return line and/or the second return line returns two-phase liquid coolant from the condenser container to the coolant unit.

14. The IT equipment cooling system of claim 13, further comprising:
- a third return line coupled between the first and the second return line; and
- a valve along a length of the third return line to switch on/off a connection path for two-phase liquid coolant to flow from the first return line to the second return line.

15. The IT equipment cooling system of claim 13, wherein the liquid release manifold is coupled in between the second return line and the condenser container.

16. The IT equipment cooling system of claim 11, wherein the condenser container mounted at the top portion of the electronic rack comprises an inlet port and an outlet port, wherein a pump circulates a cooling liquid through coils of the cooling condenser via the inlet and outlet ports.

17. The IT equipment cooling system of claim 16, wherein the condenser container is coupled to a container in the coolant unit via the first return line and at least a portion of the container in the coolant unit is located below the condenser container.

18. The IT equipment cooling system of claim 16, wherein the inlet port and outlet port are situated at a side of the condenser container.

19. The IT equipment cooling system of claim 11, further comprising a supply line between the coolant unit and the one or more servers to supply two-phase liquid coolant from the coolant unit to the one or more servers.

20. The IT equipment cooling system of claim 11, wherein the coolant unit is situated adjacent to the electronic rack.

\* \* \* \* \*